United States Patent
Jayakumar (10) Patent No.: US 12,191,866 B2
(45) Date of Patent: Jan. 7, 2025

(54) LINEAR PREDICTION TO SUPPRESS SPURS IN A DIGITAL PHASE-LOCKED LOOP

(71) Applicant: Skyworks Solutions, Inc., Irvine, CA (US)

(72) Inventor: Kannanthodath V. Jayakumar, Austin, TX (US)

(*) Notice: Subject to any disclaimer, the term of this patent is extended or adjusted under 35 U.S.C. 154(b) by 201 days.

(21) Appl. No.: 17/902,817

(22) Filed: Sep. 3, 2022

(65) Prior Publication Data

US 2023/0094645 A1 Mar. 30, 2023

Related U.S. Application Data

(60) Provisional application No. 63/250,532, filed on Sep. 30, 2021.

(51) Int. Cl.
*H03L 7/093* (2006.01)
*H03L 7/081* (2006.01)
*H03L 7/107* (2006.01)
*H04L 7/00* (2006.01)
*H04L 27/00* (2006.01)

(52) U.S. Cl.
CPC ............ *H03L 7/093* (2013.01); *H03L 7/0814* (2013.01); *H03L 7/107* (2013.01); *H04L 7/0016* (2013.01); *H04L 2027/0069* (2013.01)

(58) Field of Classification Search
CPC ....... G01R 29/26; G01R 31/317; G04F 10/00; G06F 1/04; G06F 1/08; H03L 7/02; H03L 7/04; H03L 7/06; H03L 7/08; H03L 7/10; H03L 7/093; H03L 7/099; H03L 7/107; H03L 7/197; H03L 7/0016; H03L 7/0814; H04L 7/033; H04L 25/49; H04L 27/04
USPC ................. 327/117, 156, 159; 341/131, 413; 375/219, 296, 297, 316, 371, 376
See application file for complete search history.

(56) References Cited

U.S. PATENT DOCUMENTS

| | | | |
|---|---|---|---|
| 8,514,118 B2 | 8/2013 | Eldredge | |
| 8,994,420 B2 | 3/2015 | Eldredge et al. | |
| 9,172,570 B1 * | 10/2015 | Li Puma | H03C 5/00 |
| 9,780,945 B1 | 10/2017 | Avivi et al. | |
| 10,511,315 B1 * | 12/2019 | Sarda | H03K 23/667 |
| 10,637,483 B2 | 4/2020 | Caffee et al. | |
| 10,819,353 B1 * | 10/2020 | Monk | H03L 7/23 |
| 2012/0201338 A1 * | 8/2012 | Leung | H03C 3/095 |
| | | | 375/376 |
| 2020/0272197 A1 * | 8/2020 | Mosalikanti | G06F 1/10 |

OTHER PUBLICATIONS

Carnegie Mellon, "Notes on Linear Prediction and Lattice Filters," Electrical and Computer Engineering, Digital Signal Processing I (18-791), Fall Semester, Aug. 2005.

* cited by examiner

*Primary Examiner* — Shawkat M Ali
(74) *Attorney, Agent, or Firm* — Knobbe, Martens, Olson & Bear, LLP (57) ABSTRACT

A technique uses linear prediction to determine the location of spurious content in a digital phase-locked loop and suppresses the spurious content from propagating to the clock output. In at least one embodiment, the technique implements an iterative (e.g., recursive) computation.

24 Claims, 12 Drawing Sheets

FREQUENCY RESPONSE OF LINEAR PREDICTION COEFFICIENTS

LINEAR PREDICTION TO SUPPRESS SPURS IN A DIGITAL PHASE-LOCKED LOOP

CROSS-REFERENCE TO RELATED APPLICATION(S)

This application claims the benefit of U.S. Provisional Application No. 63/250,532, entitled "LINEAR PREDICTION TO SUPPRESS SPURS IN A DIGITAL PHASE-LOCKED LOOP," naming Kannanthodath V. Jayakumar as inventor, filed on Sep. 30, 2021, which application is incorporated herein by reference.

BACKGROUND

Field of the Invention

This invention relates to generating clock signals for electronic devices and more particularly to generating clock signals using digital phase-locked loops.

Description of the Related Art

A typical clock generator utilizes a digital phase-locked loop supplied with a reference signal from a source such as a crystal oscillator to generate output clock signals having frequencies consistent with a target application. Spurious energy can be introduced into an output of the digital phase-locked loop by various coupling mechanisms, e.g., time-to-digital converter gain error and non-linearity, fractional divider periodicity (e.g., delta-sigma modulator tones), phase error introduced by truncating a phase accumulator, aliasing within the Nyquist band of quantization distortion errors, etc. Spurs are harmonic components in the phase noise spectrum that resemble vertical spikes on the data in a phase noise plot. The ideal mathematical model of a spur in a frequency domain is a Dirac delta function (i.e., a unit impulse function) multiplied by the spur amplitude. The number of spurs observed in a phase noise plot corresponds to the number of undesirable periodic tones that accompany an output clock signal. A low-spur or spur-free digital phase-locked loop is desirable because it reduces or eliminates mixing unwanted signals, prevents emission mask violations, and reduces jitter from the clock source. Suppressing these spurs can improve the output of the timing circuits. Accordingly, techniques for suppressing spurious tones are desirable.

SUMMARY OF EMBODIMENTS OF THE INVENTION

In at least one embodiment, a method for generating a clock signal using a digital phase-locked loop includes filtering a digital signal of the digital phase-locked loop using an all-zero filter having P weights. The P weights correspond to P zeros of the all-zero filter at frequencies of P spurs in the digital signal. P is an integer greater than one.

In at least one embodiment, a digital phase-locked loop includes a time-to-digital converter configured to generate a digital signal based on an input clock signal. The digital phase-locked loop is configured to generate a phase-adjusted clock signal based on the digital signal and a feedback clock signal using a frequency-divided clock signal. The digital phase-locked loop includes an all-zero filter coupled between the time-to-digital converter and an output of the digital phase-locked loop. The all-zero filter has P weights. The P weights correspond to P zeros at frequencies of P spurs in the digital signal. P is an integer greater than one.

In at least one embodiment, a method for generating a clock signal using a digital phase-locked loop includes determining P weights of an all-pole transfer function having P poles corresponding to locations of spurious energy in a digital signal of the digital phase-locked loop. The P weights are determined based on the digital signal. P is an integer greater than one.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

A linear prediction technique determines the location of spurious content in a digital phase-locked loop and suppresses the spurious content from propagating to an output of the digital phase-locked loop. In at least one embodiment, the linear prediction technique implements a die-area-efficient iterative (e.g., recursive) circuit. The linear prediction technique does not require a priori configuration or system information. The technique converges faster and collects less data than conventional techniques and can suppress multiple spurs simultaneously using the same hardware. In at least one embodiment, the linear prediction technique adapts to different phase-locked loop configurations and environmental changes without user intervention. Unlike conventional techniques (e.g., dithering) the linear prediction technique estimates the location(s) of spurious energy and suppresses that energy without increasing the noise floor of the digital phase locked loop.

Figure 1:
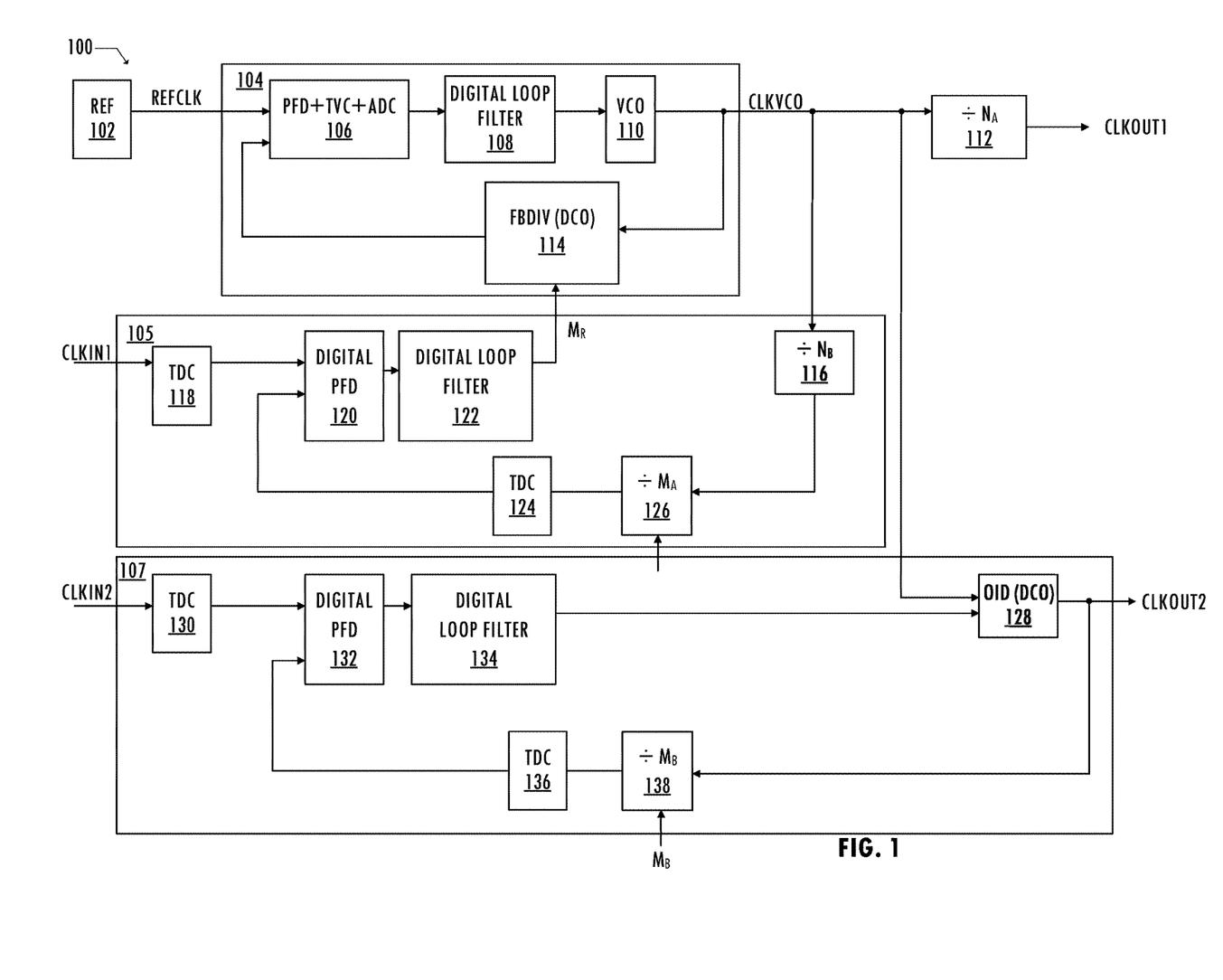
FIG. 1 illustrates a functional block diagram of a digital phase-locked loop.

FIG. 1 illustrates an embodiment of a digital phase-locked loop that is used in high performance output clock generation systems to generate various output clock signals that satisfy timing requirements of a target application. Clock integrated circuit 100 includes a multi-loop, digital phase-locked loop that generates clock signal CLKVCO having low jitter by tracking clock signal CLKIN1. In at least one embodiment, local reference clock signal REFCLK, provided by reference clock source 102, stabilizes clock signal CLKVCO in the absence of clock signal CLKIN1. Digital phase-locked loop 104 is an inner phase-locked loop that includes combination circuit 106 (including phase/frequency detector, a time-to-voltage converter and an analog-to-digital converter), loop filter 108, and voltage-controlled oscillator 110. Voltage controlled oscillator 110 may be implemented as a ring oscillator, an LC oscillator, or other suitable oscillator structure. Circuit 106 receives the clock signal from reference clock source 102, which includes a fixed source such as a crystal oscillator, an oven-controlled crystal oscillator, a microelectromechanical structure (MEMS) oscillator, or other suitable low-jitter source. In at least one embodiment, digital phase-locked loop 104 is coupled to an inner-most phase-locked loop (not shown) that locks to a local crystal oscillator.

Digital phase-locked loop 105 is an outer digital phase-locked loop that includes time-to-digital converter 118, phase/frequency detector 120, digital loop filter 122, frequency divider 126 (e.g., a fractional divider), and uses digital phase-locked loop 104 as a digitally controlled oscillator for phase-locked loop 105. The digitally controlled oscillator is responsive to divider value $M_R$, which may be a fractional divide value provided by digital loop filter 122. Phase/frequency detector 120 receives timestamps based on clock signal CLKIN1 and feedback timestamps provided by time-to-digital converter 124 based on a feedback clock signal generated by frequency divider 126. The feedback clock signal may be based on a frequency-divided version of clock signal CLKVCO. Digital phase/frequency detector 120 provides a digital phase error signal reflecting the difference between clock signal CLKIN1 and the digital feedback clock signal. The frequency of clock signal CLKVCO is determined by the frequency of clock signal CLKIN1 and the divider value $M_R$ provided by digital loop filter 122 and provided to feedback divider 114 (e.g., a fractional divider) in the feedback path of inner digital phase-locked loop 104. Digital phase-locked loop 105 adjusts divider value $M_R$ to match the frequency of clock signal CLKVCO to a multiple of the frequency of clock signal CLKIN1 implemented using frequency divider 126 and frequency divider 116 (e.g., frequency(CLKIN1)=frequency(CLKVCO)/$M_A$ $N_B$). The frequency of CLKOUT1 provided by frequency divider 112 is based on the frequency of clock signal CLKVCO and divider value NA.

Digital phase-locked loop 107 receives a clock signal CLKIN2 and configures output interpolative divider 128 as a digitally controlled oscillator to generate clock signal CLKOUT2 using clock signal CLKVCO as a low-jitter reference clock signal. Clock signal CLKOUT2 has a frequency determined by the frequency of clock signal CLKIN2 and the divider value MB provided to frequency divider 138. Time-to-digital converter 136 provides feedback timestamps to digital phase/frequency detector 132. Digital loop filter 134 provides a digital control signal to output interpolative divider 128 based on the digital phase error signal reflecting the difference between clock signal CLKIN2 and the feedback clock signal. The digital control signal causes output interpolative divider 128 to match the frequency of clock signal CLKOUT2 to a multiple of the frequency of clock signal CLKIN2. Circuits that may introduce spurs in an output clock signal include circuit 106, time-to-digital converter 118, time-to-digital converter 124, time-to-digital converter 130, time-to-digital converter 136, feedback divider 114, output interpolative divider 128. Accordingly, application of the spur suppression technique at outputs of one or more of those circuits can attenuate or eliminate spurious energy in an output clock signal.

Figure 2:
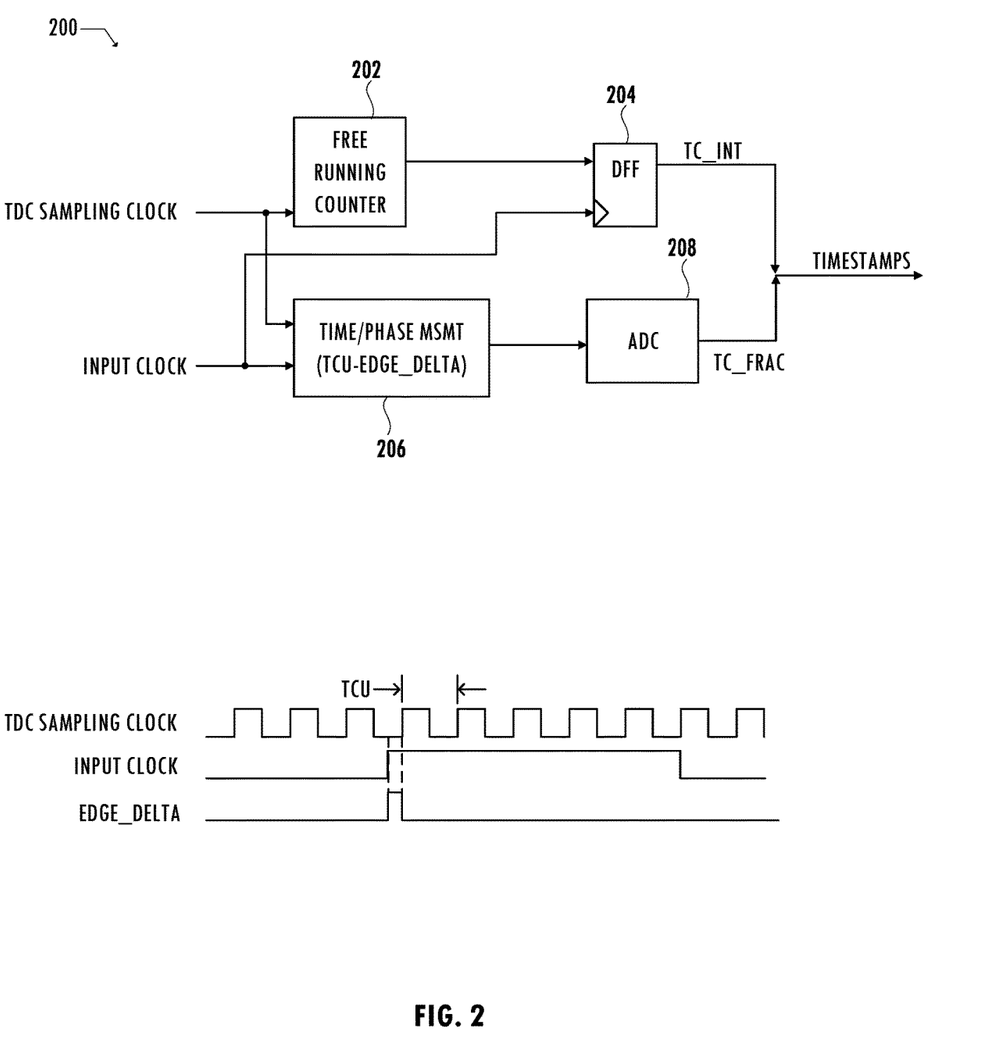
FIG. 2 illustrates a functional block diagram and timing waveforms for an exemplary time-to-digital converter.

FIG. 2 illustrates an embodiment of a time-to-digital converter circuit that may be used in a digital phase-locked loop and may introduce spurious energy into the clock output of a digital phase locked loop. Time-to-digital converter 200 generates an integer time code TC_INT and a fractional time code TC_FRAC that are combined at the output to generate output digital signal TIMESTAMPS based on clock signal INPUT CLOCK and clock signal TDC SAMPLING CLOCK. Clock signal TDC SAMPLING CLOCK controls free running counter 202, which generates an output integer count signal that is synchronized to clock signal INPUT CLOCK by a storage element (e.g., D flip-flops 204). The output of D flip-flops 204 is integer time code TC_INT, which indicates the integer number of full cycles of clock signal TDC SAMPLING CLOCK in a period of clock signal INPUT CLOCK.

Time/phase measurement circuit 206 generates an indication of time difference EDGE_DELTA between edges of clock signal TDC SAMPLING CLOCK and clock signal INPUT CLOCK 206. That difference is digitized by analog-to-digital converter 208, which provides a digital version of that difference as fractional time code TC_FRAC. In an embodiment, the fractional time code is a residue that can range from 0 to 1 unit interval (UI) of the sampling clock. Clock signal INPUT CLOCK has input frequency $$F_{in} = \frac{F_{ref}}{N+\alpha}; 0 \le \alpha < 1,$$

where N corresponds to the integer number of the integer number of full cycles of clock signal TDC SAMPLING CLOCK in a period of clock signal INPUT CLOCK and a corresponds to the residue. The residue has a periodicity of $\alpha*F_{in}$ and is sampled at $F_{in}$. Quantization error occurs due to the conversion of the residue into digital codes and produces time/phase noise in the power spectral density. The periodicity of the quantization error introduces spurious information into the output digital signal since this error follows a sawtooth wave. In addition, non-linearity of time-to-digital converter circuit 200 can produce a periodic time error that may be different from sawtooth in nature, contributing to spur generation on the output digital signal that is being generated inside the digital phase-locked loop.

A linear predictive coding technique estimates a transfer function for injection of spurious energy. That transfer function is used to determine weights (e.g., a set of coefficients) that are applied to digital signals (i.e., samples) generated in the digital phase-locked loop, e.g., timestamps generated by a time-to-digital converter, divider codes provided to a digitally controlled oscillator, or a divider code provided to an output interpolative divider.

Figure 3:
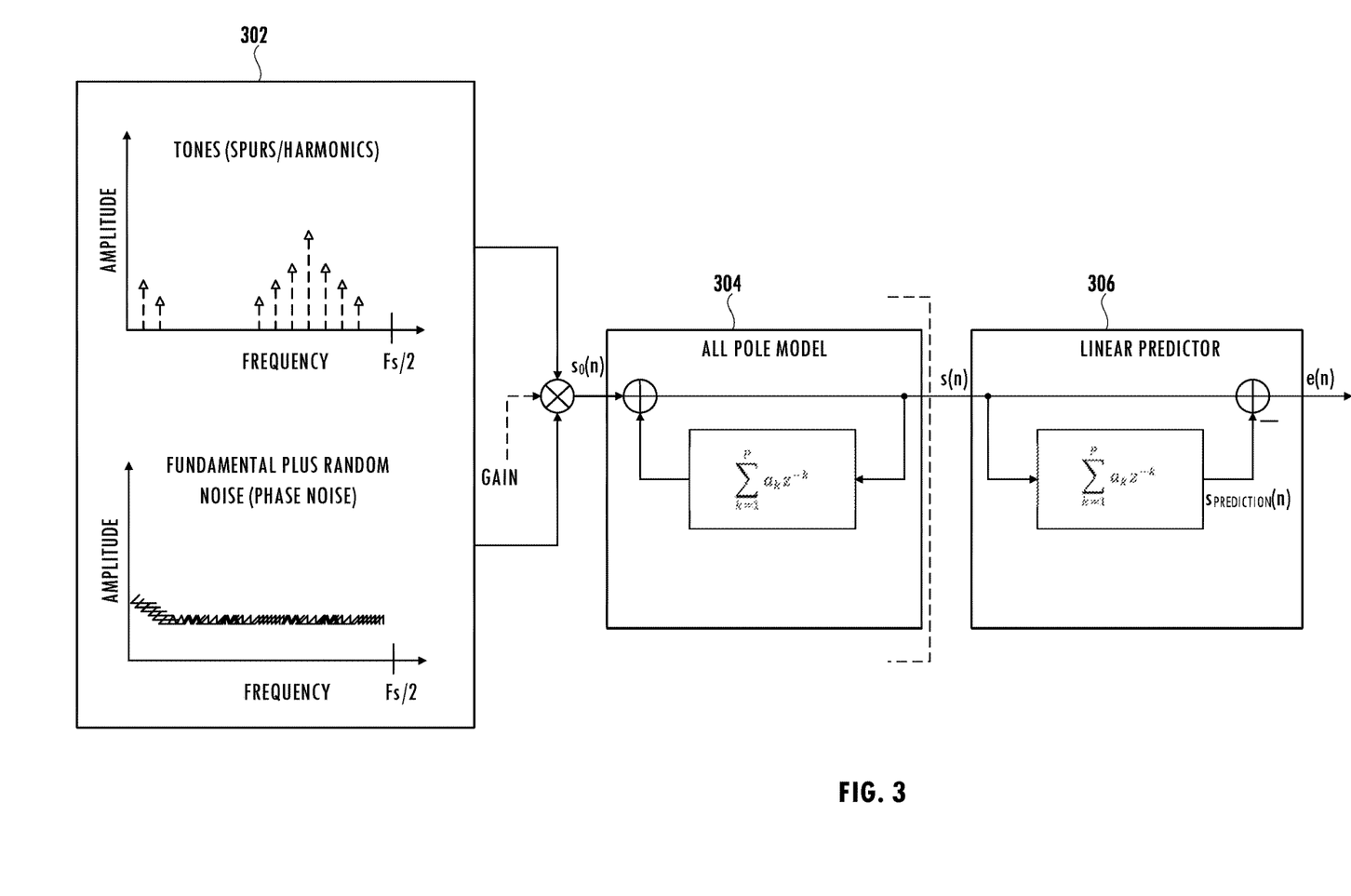
FIG. 3 illustrates a model of a system including spurious energy sources and a linear prediction filter to suppress spurs in an output of the system consistent with at least one embodiment of the invention.

Referring to FIG. 3, model 302 illustrates a spectrum of an exemplary digital signal of a digital phase-locked loop separated into frequency components of spurious tones and harmonics and a random phase noise component. Each of the spurious tones in the phase noise plot is a different undesired signal accompanying the clock output. For example, it can be due to time-to-digital converter gain error and non-linearity, phase error truncation of a frequency control word generated by a digitally controlled oscillator, or non-linearity of a phase interpolator. That frequency information can be considered an excitation phenomenon inside a source generation circuit and can be modelled as an undesired "extra pole" in the transfer function of the generating circuit. Accordingly, the spur-generating source is modelled as an all-pole transfer function with the number of poles P being a function of a number of periodic events or frequency content with a specific energy associated with it.

All-pole model 304 represents unknown sources that generate undesired spurious tones in the system as poles in transfer function. The DC component and random noise associated with the source is not of interest and can be removed by high pass filtering to prevent interference with the linear prediction technique. The spur suppression technique addresses the unwanted tones that appear above the noise that appear in-band after filtering (e.g., by a loop filter). In at least one embodiment, gain is applied to the spurious energy in the data chain. Linear predictor 306 is used to generate an error sequence between the signal and a predicted signal. The error sequence is used to generate coefficients for an all zero-filter.

The transfer function of an all-pole system is defined as follows:

$$H(z) = \frac{1}{1 - \Sigma_{k=1}^{P} a_k z^{-k}}.$$

The value P determines the number of poles in the transfer function and is predetermined according to a target number of spurs to be suppressed. The selection of P approximates frequency content or excitation by a P pole system. The transfer function above corresponds to a linear difference equation that predicts future data from a linear combination of weighted past samples:

$$s_{prediction}(n) = \left(\sum_{k=1}^{P} a_k s(n-k)\right);$$

$$\frac{s_{prediction}(n)}{s(n)} = P(z) = \left(\sum_{k=1}^{P} a_k z^{-k}\right).$$

The prediction error can be represented as $A(z)=1-P(z)$ where $A(z)$ is an inverse filter of $H(z)$ and is defined as all-zero filter. All-zero filters nullify the energy of the frequency content defined by the measured coefficients that originally generated the excitation that is modelled as the all-pole filter. However, if too many poles are included in the model, the model will include harmonics and becomes distorted.

Solving for the pole coefficients of the transfer function from the previous digital samples, the pole coefficients are used to inverse-filter future digital samples to suppress spurs. The pole coefficients may be determined by minimizing the error sequence $e(n)$. This error sequence provides information regarding the spurious excitation only, while removing other harmonic peaks that are fundamental to the clock characteristics. This technique allows accurate measurement of spur location by identifying the error energy. If no spurious energy is present, then there are no errors, and a future digital code is the same as a linear combination of past digital codes. Accordingly, the sum of the error squared can be obtained and expanded as follows:

$$E = \left(\sum_{n=1}^{N} e(n)^2\right) = \sum_{n=1}^{N}\left[s(n) - \sum_{R=1}^{P} a_k s(n-k)\right]^2.$$

After minimization, solving for P equations provides coefficients $a_k$.

$$\Sigma_{k=1}^{P} a_k \Sigma_{n=1}^{N} s(n-k)s(n-i) = \Sigma_{n=1}^{N} s(n)s(n-i), \text{ for } i=1,2,3,\ldots,P.$$

The expansion includes P linear simultaneous equations to solve for P unknown coefficients $a_k$. The above error-squared equations can be re-written as an autocorrelation function. Minimizing the sum of the error squared is performed by setting the partial differentiation of the error equal to zero (i.e., $$\frac{\partial E}{\partial a_k} = 0,$$

with every P coefficient from E) to find the optimal coefficients of the linear predictor. The P simultaneous equations can be rewritten as auto-correlation function R:

$$\sum_{n=1}^{N} s(n)s(n-i) = R(i)$$

The above P simultaneous equations written in matrix form with autocorrelation values is $[R][a_k]=[R']$, where R is P×P matrix, and $a_k$ is a P×1 matrix and R' is a P×1 matrix. In at least one embodiment, an autocorrelation technique with optimized hardware and fast convergence is used. Matrix inversion of R and a multiply with R' are required to solve for $a_k$.

From the above error-squared minimization problem, we can write the below equation where R(i) is the autocorrelation of data sample with lag of i for i=1, 2, ..., P:

$\sum_{i=1}^{P} a_k R(k-i) = r(i)$, for $i=1, 2, ..., P$ and $R(i) = \sum_{n=1}^{N} \lfloor s(n) s(n-i) \rfloor^1$.

These equations implicitly express the optimal linear predictive coding coefficients implicitly, and in terms of autocorrelation functions of the observed random data samples and of deterministic unit sample response.

Where P=2, expanding for a second order predictor obtains the following matrix that can be solved for $a_1$ and $a_2$:

$$\begin{bmatrix} R(0) & R(1) \\ R(1) & R(0) \end{bmatrix} \begin{bmatrix} a_1 \\ a_2 \end{bmatrix} = \begin{bmatrix} R(1) \\ R(2) \end{bmatrix},$$

where R(i) is the autocorrelation of a digital code with a lag of i, for i=1, 2, ..., P. This matrix form is a Toeplitz matrix (i.e., the matrix is symmetric and all elements in the main diagonal are equal) and can be solved recursively (e.g., using Levinson-Durbin recursion, which is explained further below). The recursive solution predicts the coefficients in a hardware-efficient manner, especially when P is much greater than two.

Levinson-Durbin recursion, is a hardware-efficient technique for generating the predicted coefficients for a Toeplitz matrix. The recursive technique is based on two basic operations: determining the autocorrelation from observed samples and the matrix operation to determine the coefficients.

$E(0) = R[0]$; initialize first error term for $i = 1$ to $p$, recursively compute $$k_i = \frac{\left(R[i] - \sum_{j=1}^{i-1} a_j^{(i-1)} R[i-j]\right)}{E^{(i-1)}};$$

this internal term is referred to as a partial correlation coefficient $a_i^{(k)} = k_i$;

if $i > 1$, then for $j = 1, 2, ..., i-1$;

$a_j^{(i)} = a_j^{(i-1)} - k_i a_{i-j}^{(i-1)}$;

end;

$E^i = (1 - k_i^2) E^{i-1}$;

end;

$a_j = a_j^p$ for $j = 1, 2, ..., P$.

For example, where P=2:

$$\begin{bmatrix} R(0) & R(1) \\ R(1) & R(0) \end{bmatrix} \begin{bmatrix} a_1 \\ a_2 \end{bmatrix} = \begin{bmatrix} R(1) \\ R(2) \end{bmatrix}.$$

Solving for coefficients $a_1$ and $a_2$ via matrix inversion and multiplication:

$$\begin{bmatrix} a_1 \\ a_2 \end{bmatrix} = \frac{1}{R^2(0) - R^2(1)} \begin{bmatrix} R(0) & -R(1) \\ -R(1) & R(0) \end{bmatrix} \begin{bmatrix} R(1) \\ R(2) \end{bmatrix};$$

$$\begin{bmatrix} a_1 \\ a_2 \end{bmatrix} = \frac{1}{R^2(0) - R^2(1)} \begin{bmatrix} R(0)R(1) - R(1)R(2) \\ -R^2(1) + R(0)R(2) \end{bmatrix}.$$

Solving for coefficients $a_1$ and $a_2$ via Levinson-Durbin recursion:

$E^0 = R(0)$;

$k_1 = \frac{R(1)}{E^0} = \frac{R(1)}{R(0)}$;

$a_1^{(1)} = k_1$ $E^1 = (1 - k_1^2) R(0) = \frac{R^2(0) - R^2(1)}{R(0)}$;

$k_2 = \frac{R(2)R(0) - R^2(1)}{R^2(0) - R^2(1)}$;

$a_2^{(2)} = k_2$;

$a_1^{(2)} = a_1^{(1)} - k_2 a_1^{(1)} = \frac{R(1)R(0) - R(1)R(2)}{R^2(0) - R^2(1)}$;

$a_1 = a_1^{(2)}$;

$a_2 = a_2^{(2)}$.

Figure 4:
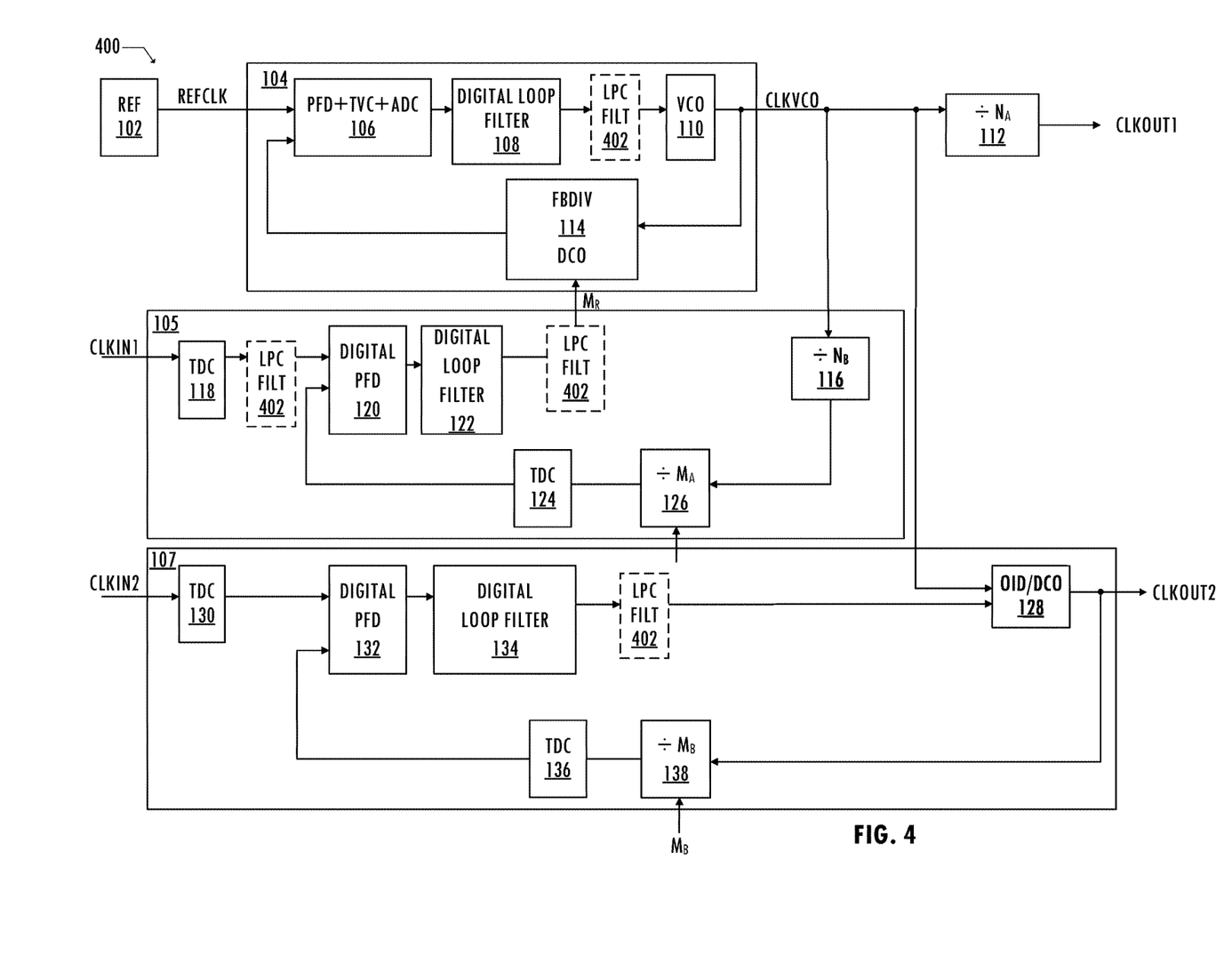
FIG. 4 illustrates a functional block diagram of a digital phase-locked loop implementing a linear prediction technique to suppress spurs consistent with at least one embodiment of the invention.
Figure 5:
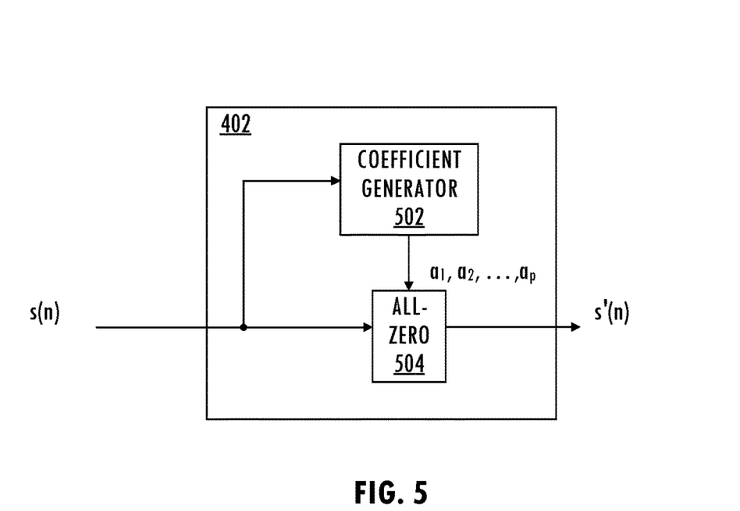
FIG. 5 illustrates a functional block diagram of an exemplary linear prediction filter to suppress spurs consistent with at least one embodiment of the invention.
Figure 6:
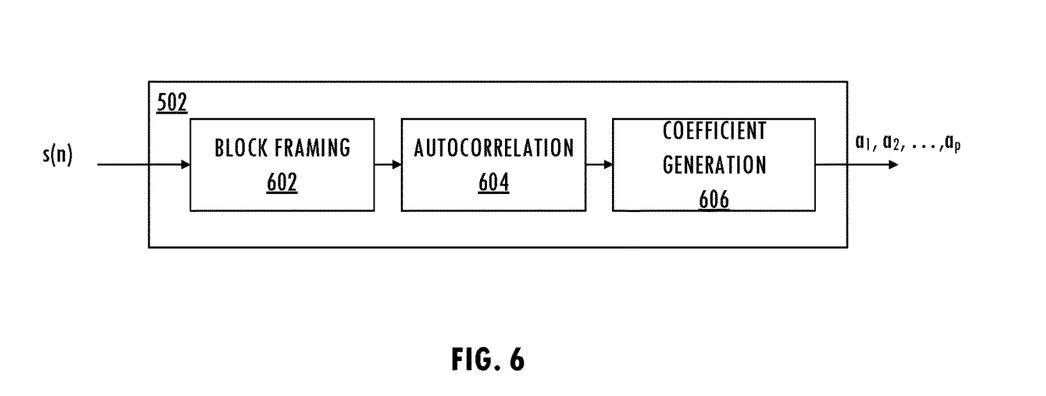
FIG. 6 illustrates a functional block diagram of an exemplary coefficient generator consistent with at least one embodiment of the invention.

Referring to FIGS. 4 and 5, in at least one embodiment, coefficients $a_1$ are used as zeros and applied using an all-zero linear finite impulse response (FIR) filter to suppress unwanted tones in the spectrum. In at least one embodiment of a digital phase-locked loop, linear prediction filter 402 is applied to at least one node inside a digital phase-locked loop. For example, in digital phase-locked loop 400, linear prediction filter is coupled to the output of digital loop filter 108, time-to-digital converter 118, digital loop filter 122, or digital loop filter 134. In at least one embodiment, linear prediction filter 402 includes coefficient generator 502 to determine coefficients (e.g., $a_1, a_2, ..., a_P$) that are used by all-zero filter 504. All-zero filter 504 is a finite impulse response (FIR) filter having coefficients based on the predicted coefficients. FIG. 5 illustrates an embodiment of linear prediction filter 402 that uses block framing 602 to identify spur content in a region to be used in auto-correlation linear predictive coding analysis. In at least one embodiment, block framing 602 windows digital signal s(n) to select a predetermined number of past samples of digital signal s(n) to determine coefficients that minimize the mean squared error:

$E = (\sum_{n=1}^{N} e(n)^2) = \sum_{n=1}^{N} \lfloor s(n) - \sum_{k=1}^{P} a_k s(n-k) \rfloor^2$.

The block has a length that corresponds to a duration of samples that need to contain the frequencies of spurs that are being predicted. For example, if a spur is located around 1 kHz, then length N corresponding to a duration of 3-4 ms (i.e., 3-4 times $\frac{1}{1000}$ Hz) is used in block framing. If the frame under analysis contains few spur periods, then N>>P and the spectral accuracy improves because linear prediction models the spectral envelope well for the spur frequencies in the sample history that includes the excitation.

In at least one embodiment, the output of block framing 602 is provided to autocorrelation circuit 604, which provides autocorrelated values for a digital signal to coefficient generator 606. In at least one embodiment, those functions are integrated into shared circuitry. The block framing can be fine-tuned based on the target application. For example, an embodiment of coefficient generator 502 removes a DC component before predicting spurs of interest or windowing the digital codes to remove edge effects that would otherwise corrupt the analysis. In some applications, a pre-emphasis operation boosts a region of spectral content to amplify spurs of interest for effective cancellation.

The computation of matrix correlation values and recursive solution of coefficients can be combined for a simpler hardware implementation of the optimized filter. Rather than calculate the actual coefficients, intermediate partial correlation coefficients (k) are used to realize the implementation of FIGS. 7 and 8. An embodiment of linear prediction filter 402 includes coefficient generator 702 that provides partial correlation coefficients $k_1, k_2, \ldots, k_p$ to all-zero lattice filter 704.

Figure 7:
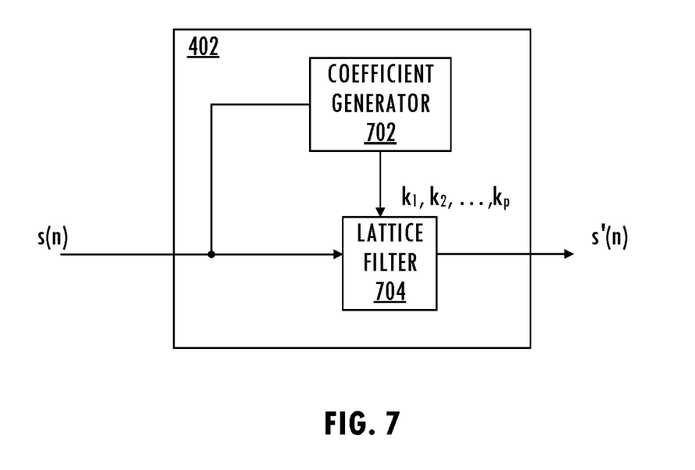
FIG. 7 illustrates a functional block diagram of an exemplary linear prediction filter to suppress spurs consistent with at least one embodiment of the invention.

In at least one embodiment, coefficient generator 702 implements the following steps described above with respect to Levinson-Durbin recursion:

$$a_j^{(i)} = a_j^{(i-1)} - k_i a_{i-j}^{(i-1)}; \text{ and}$$

$$a_i^{(i)} = k_i.$$

Thus, coefficient generator 702 is configured to iteratively determine the $i^{th}$ order filter $A^i(z)$:

$$A^i(z) = A^{i-1}(z) - k_i z^{-i} A^{i-1}(z^{-1}).$$

The first term is the z-transform of the forward prediction error for the $(i-1)^{th}$ order predictor, $e^{i-1}(m)$, and similarly, the second term is the backward prediction error for the $(i-1)^{th}$ order predictor, $b^{i-1}(m-1)$.

To predict future samples of the digital signal, s(n–i), the technique uses i samples of the digital signal, s(n). Although the equations above seem causal in some sense, causality can be considered as removed by adding delayed samples. Alternatively, if we have enough sample history, the same set of samples is used to predict backward prediction error for the sample at s(n–i) and forward prediction error at s(n).

In the time domain, the forward prediction error for the $i^{th}$ order predictor in terms of the corresponding prediction errors of an $(i-1)^{th}$ using past backward prediction error is:

$$e^i(m) = e^{i-1}(m) - k_i b^{i-1}(m-1).$$

The backward prediction error is:

$$b^i(m) = b^{i-1}(m-1) - k_i e^{i-1}(m).$$

Figure 8:
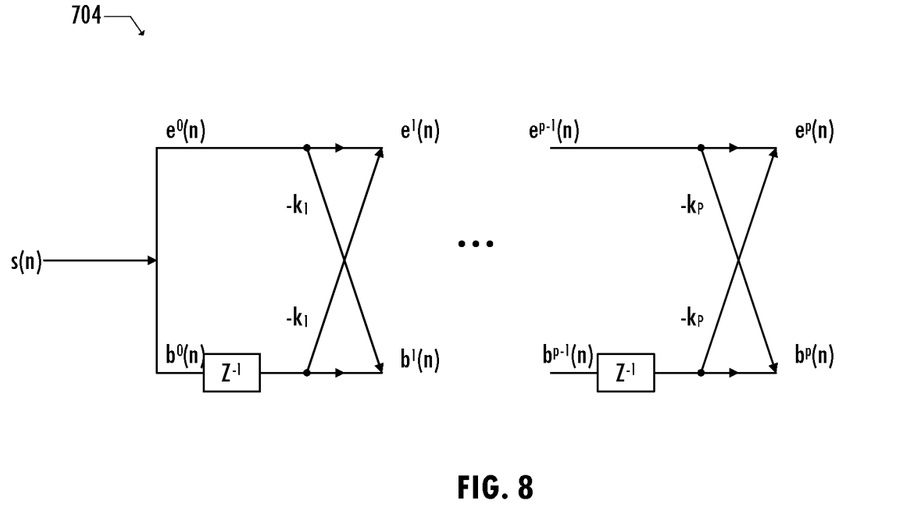
FIG. 8 illustrates a functional block diagram of an exemplary all-zero lattice filter to suppress spurs consistent with at least one embodiment of the invention.

In at least one embodiment of the lattice filter formulation, the initial state of the forward prediction error $e^0$ is the current sample itself and the initial state for the backward prediction error $b^0$ is the same. Thus, lattice filter 704 uses the initial state s(n) and the $k_i$ determined by coefficient generator 702. The lattice filter implementation has the benefit of not needing autocorrelation data to be available thus reducing circuit requirements.

Figure 9:
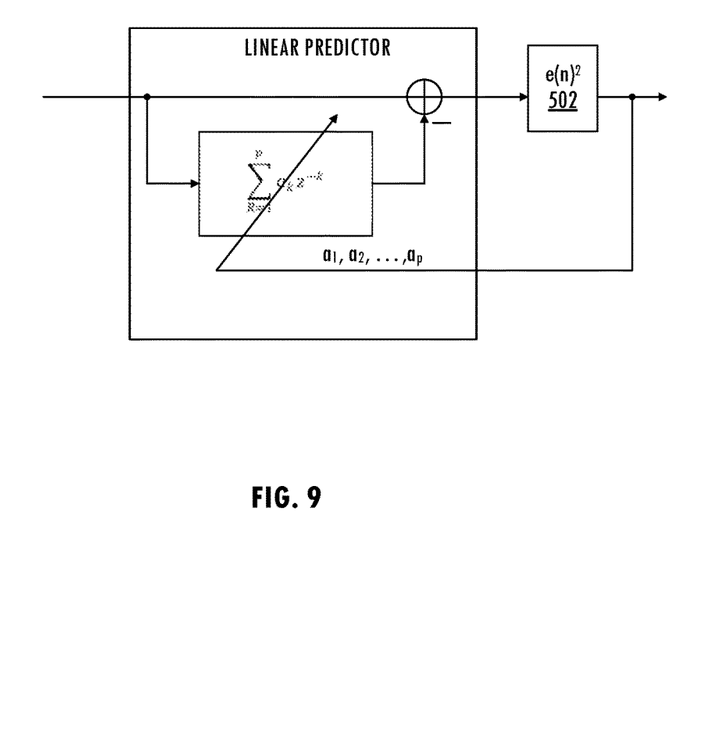
FIG. 9 illustrates a functional block diagram of an exemplary adaptive linear prediction filter consistent with at least one embodiment of the invention.

In at least one embodiment, the technique uses linear prediction to adaptively suppress spurs for different phase-locked loop configurations or under varying environmental conditions. Referring to FIG. 9, in at least one embodiment, the linear prediction filter generates updated coefficients based on new samples. Coefficients may be updated periodically or in response to a predetermined amount of change in a sensed parameter. A predictor coefficient is continuously updated in response to every new sample to reduce squared prediction error to a minimum value (i.e., global minima). In at least one embodiment, the linear prediction filter implements a steepest descent algorithm for adaptively converging coefficients to achieve the minimum squared error and allows calculation of the coefficients on a sample-by-sample basis, rather than a frame-by-frame basis. The updated coefficient can be calculated as $$a_k(n+1) = a_k(n) + c \times e(n) \times s(n-k),$$

where c is a learning rate between $0 < c < 1$ and k is between $1 \le k \le P$. In at least one embodiment, the learning rate is fine-tuned (e.g., experimentally) in order to reduce issues in finding a global minimum.

Figure 10A:
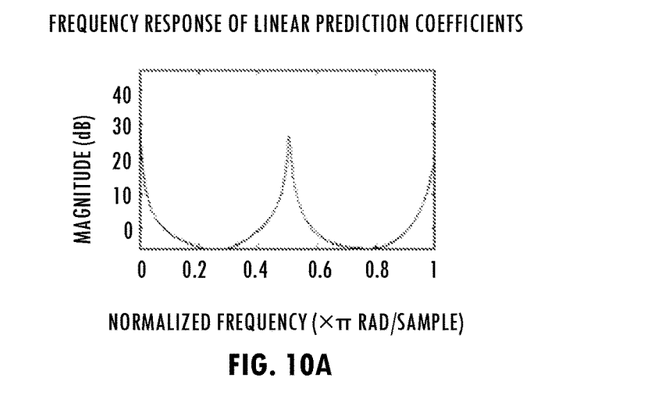
FIGS. 10A, 10B, and 10C illustrate the frequency response of predicted coefficients, the spectral density before a linear prediction filter, and the spectral density after the linear prediction filter, respectively, for a single injected spur consistent with at least one embodiment of the invention.
Figure 10B:
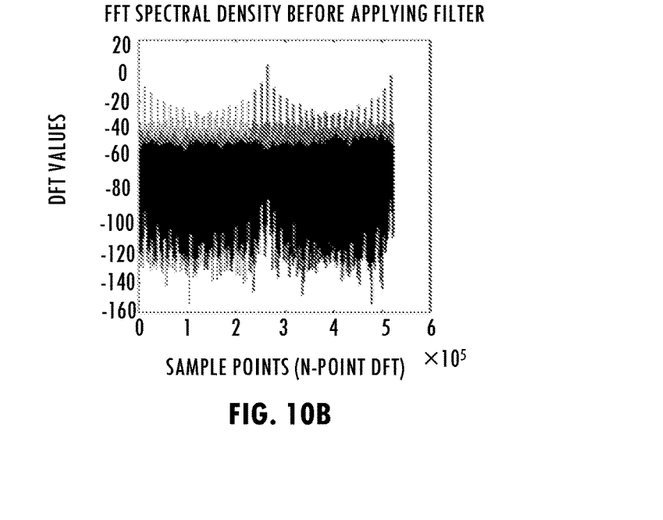
Figure 10C:
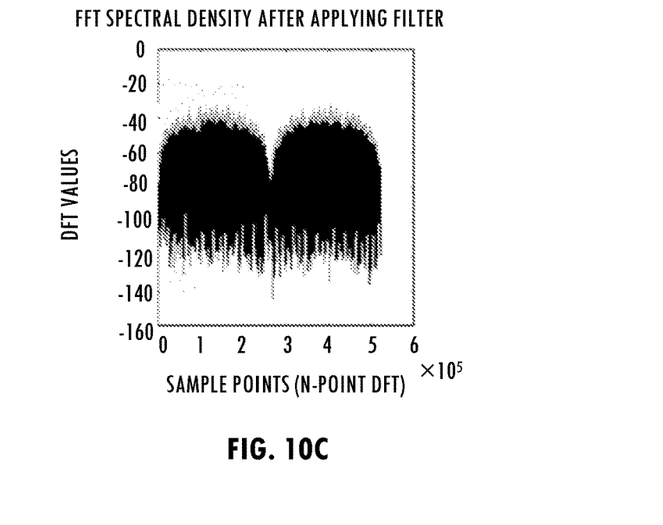

FIG. 10A illustrates a frequency response of predicted coefficients generated using the linear prediction technique described above for an exemplary embodiment of a digital phase-locked loop where a time-to-digital converter introduces a single spur. FIG. 10B illustrates an exemplary signal spectral density before applying the all-zero filter generated by the linear prediction technique described above. FIG. 10C illustrates an exemplary signal spectral density after applying the all-zero filter generated by the linear prediction technique described above.

Figure 11A:
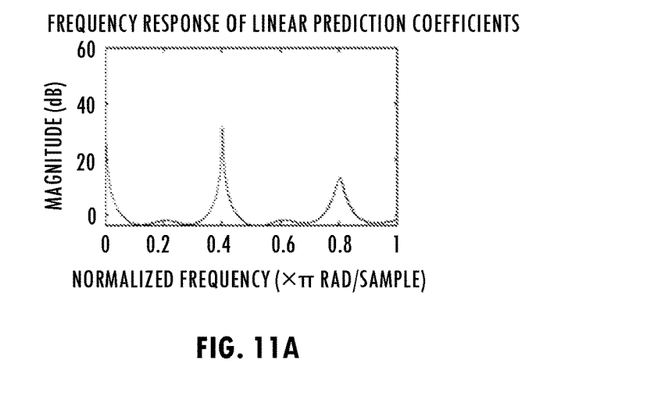
FIGS. 11A, 11B, and 11C illustrate the frequency response of predicted coefficients, the spectral density before a linear prediction filter, and the spectral density after the linear prediction filter, respectively, for two injected spurs consistent with at least one embodiment of the invention.
Figure 11B:
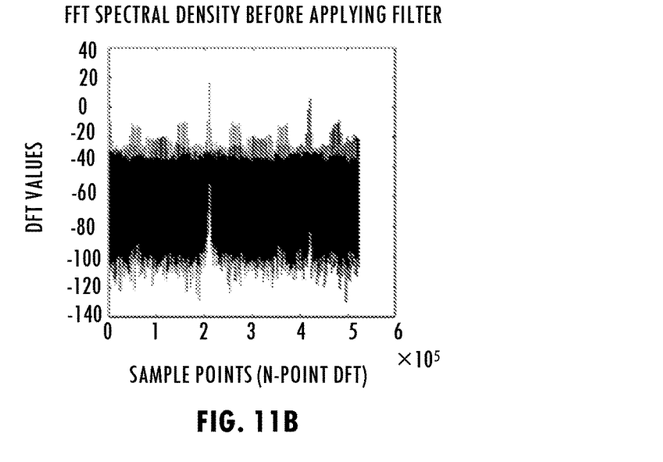
Figure 11C:
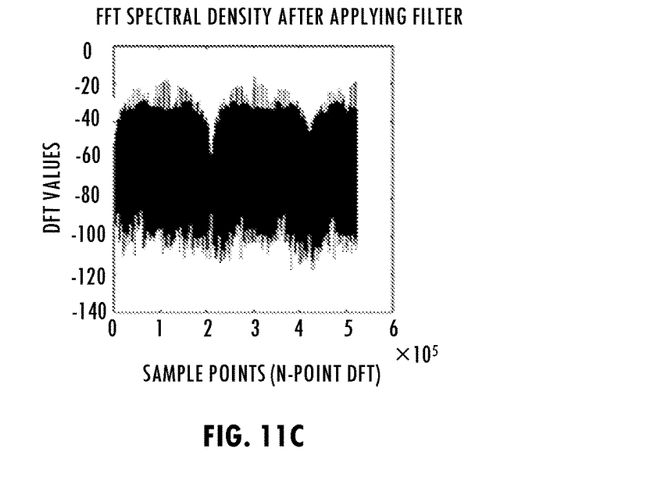

FIG. 11A illustrates a frequency response of predicted coefficients generated using the linear prediction technique described above for an exemplary embodiment of a digital phase-locked loop where a time-to-digital converter introduces two spurs. FIG. 11B illustrates an exemplary signal spectral density before applying the all-zero filter generated by the linear prediction technique described above. FIG. 11C illustrates an exemplary signal spectral density after applying the all-zero filter generated by the linear prediction technique described above.

Figure 12A:
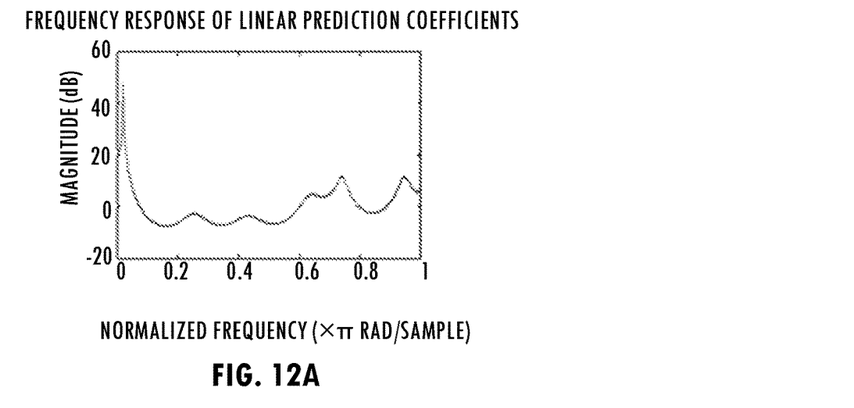
FIGS. 12A, 12B, and 12C illustrate the frequency response of predicted coefficients, the spectral density before a linear prediction filter, and the spectral density after the linear prediction filter, respectively, for an injected sinusoidal modulation jitter tone consistent with at least one embodiment of the invention.
Figure 12B:
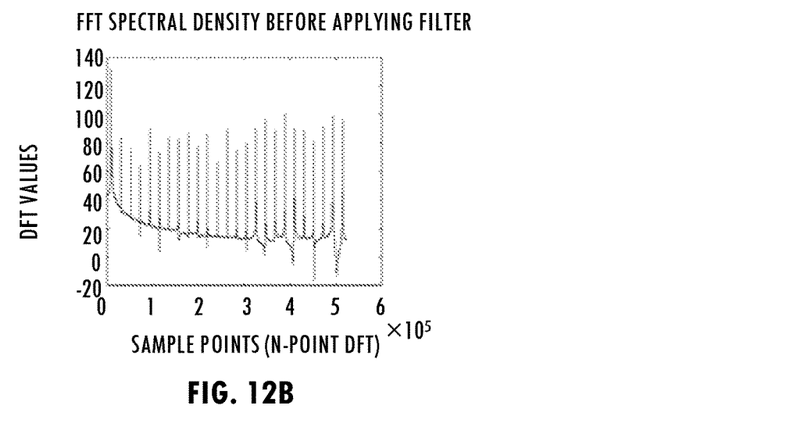
Figure 12C:
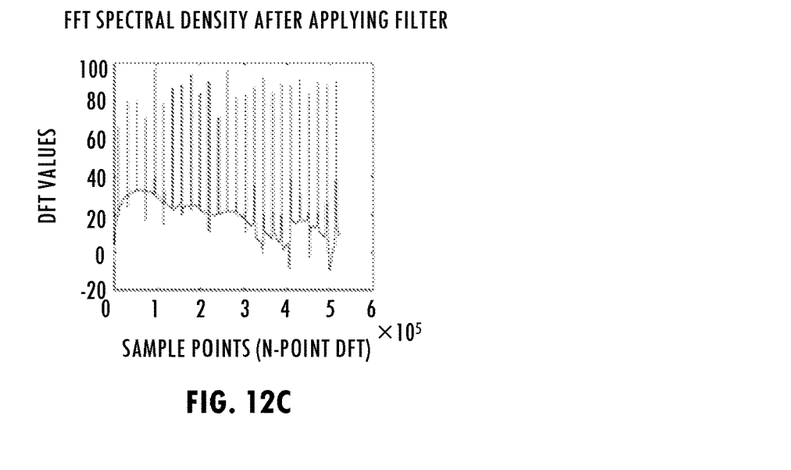

FIG. 12A illustrates a frequency response of predicted coefficients generated using the linear prediction technique described above for an exemplary embodiment of a digital phase-locked loop at the output of a time-to-digital converter, where an external source introduces a sinusoidal jitter tone. A second-order difference of the timestamps or samples of the digital signal removes DC information, and the linear prediction technique operates on actual spurs. FIG. 12B illustrates an exemplary signal spectral density before applying the all-zero filter generated by the linear prediction technique described above. FIG. 12C illustrates an exemplary signal spectral density after applying the all-zero filter generated by the linear prediction technique described above.

Figure 13A:
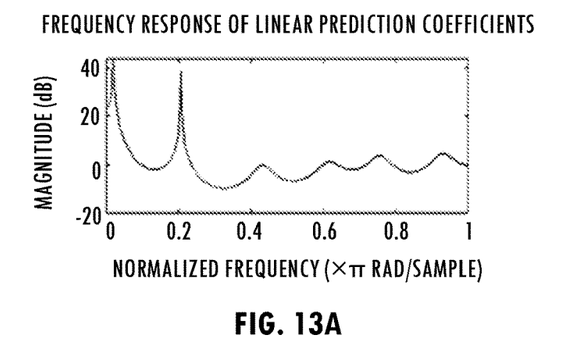
FIGS. 13A, 13B, and 13C illustrate the frequency response of predicted coefficients, the spectral density before a linear prediction filter, and the spectral density after the linear prediction filter, respectively, for two injected sinusoidal modulation jitter tones consistent with at least one embodiment of the invention.
Figure 13B:
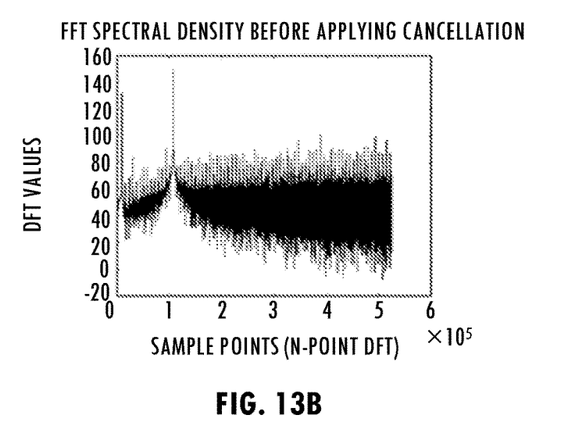
Figure 13C:
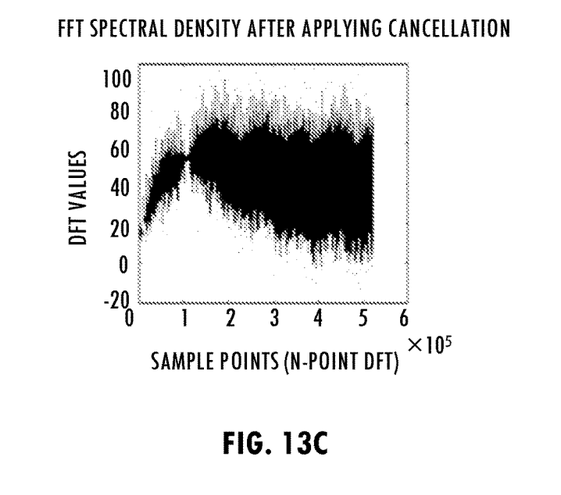

FIG. 13A illustrates a frequency response of predicted coefficients generated using the linear prediction technique described above for an exemplary embodiment of a digital phase-locked loop at the output of a time-to-digital converter, where an external source introduces two sinusoidal jitter tones. A second-order difference of the timestamps or samples of the digital signal removes DC information, and the linear prediction technique operates on actual spurs. FIG. 13B illustrates an exemplary signal spectral density before applying the all-zero filter generated by the linear prediction technique described above. FIG. 13C illustrates an exemplary signal spectral density after applying the all-zero filter generated by the linear prediction technique described above.

Figure 14:
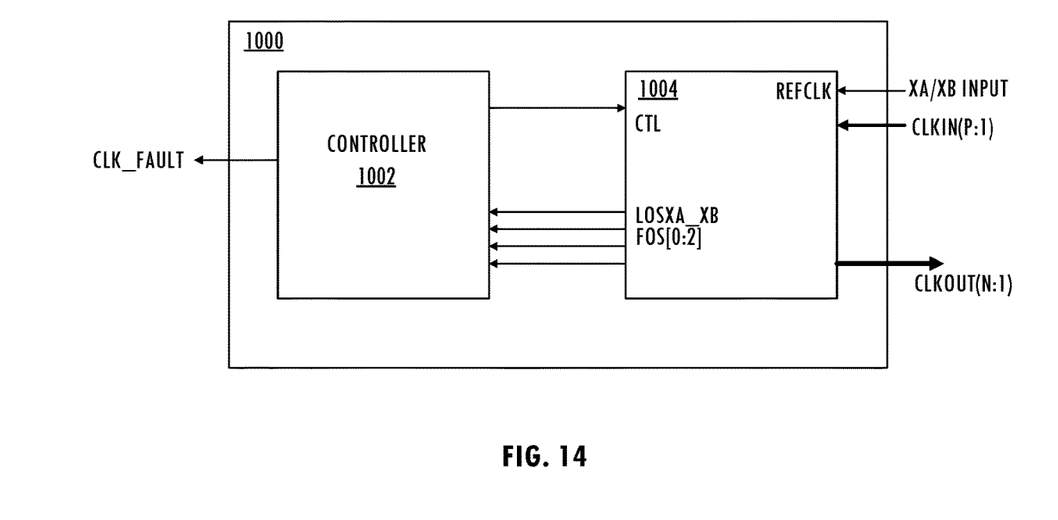
FIG. 14 illustrates a functional block diagram of an exemplary clock product including a digital phase-locked loop.

FIG. 14 illustrates an embodiment of a clock product that includes a digital phase-locked loop described above. Clock product 1000 includes controller 1002 and clock generator 1004, which monitors at least one received clock signal (e.g., CLKIN(P:1)) using clock signal REFCLK (e.g., a clock signal generated using a crystal oscillator including an external crystal coupled to XA/XB input terminal) and provides at least one output clock signal CLKOUT(N:1) and at least one clock quality signal, where P and N are integers greater than zero. In an embodiment of clock product 1000, clock signal REFCLK is generated based on a stable source such as crystal oscillator, a microelectromechanical structure (MEMS) oscillator, or other suitable low-jitter source. Controller 1002 provides configuration information to clock generator 1004 using interface signals CTL. Clock generator 1004 provides clock quality information (e.g., LOSXA_XB or CLK_STATUS) to controller 1002, which outputs one or more alarm signals (e.g., CLK_FAULT) based on the clock quality information.

In at least one embodiment, the digital phase-locked loop implementing linear prediction techniques described above is included in a network communication box that uses timing protocols to ensure time of day (ToD) counters in the network are synchronized. SYNC signals are used to update time of day counters at the same time in the network. Any delay/offset and process, voltage, temperature (PVT) variation between the SYNC lines being supplied to the ToD counters in each line card in the network box results in an error that is classified as Continuous Time Error (CTE). Network communications are used to communicate various status and information regarding the system.

Figure 15:
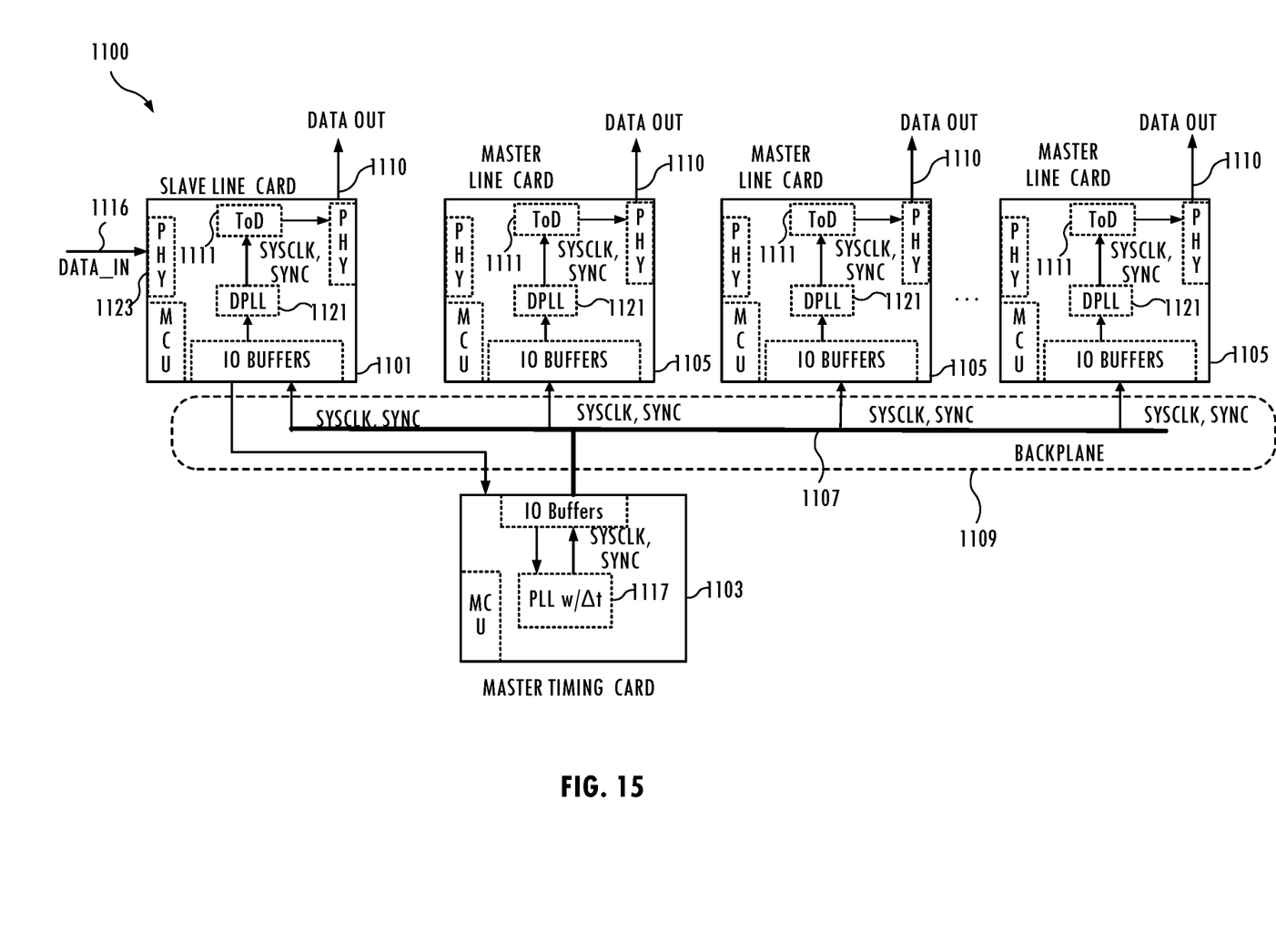
FIG. 15 illustrates a typical communication network system with a slave line card (LC), a master timing card (TC), and multiple master line cards coupled through a backplane and including embodiments of a digital phase locked loop.

FIG. 15 shows a typical architecture of a communication network system. Communication network system includes a slave line card (LC) 1101, a master timing card (TC) 1103, and multiple master line cards 1105. The DATA OUT 1110 from each line card is time stamped using time stamps from local Time of Day (ToD) counters 1111. The master timing card 1103 generates a SYNC signal and system clock signal (SYSCLK) using DPLL 1117 and dividers (not shown). The SYNC signal is also referred to as the FSYNC (frame sync) signal in certain contexts since the signal has different names (SYNC or F SYNC) at the system level or integrated circuit level inside the network box. The signal will be referred to as the SYNC signal herein for ease of reference. Master timing card 1103 supplies the SYSCLK and SYNC signal (shown as signals 1107) to slave line card 1101 and master line cards 1105 over backplane 1109. The SYNC signal is a global signal inside the network system box 1100 that signifies the right moment/edge for the Time of Day (ToD) counters 1111 to rollover. The SYNC signal typically has a frequency range of 8 kHz to PP2S (pulse per 2 seconds). In many network systems the SYNC signal is a 1 pulse per second (1PPS) signal. SYNC is an integer divided down and edge-aligned version of system clock signal SYSCLK. The various ToD counters 1111 contain the same value and turnover at the same time based on the SYNC signal. Each of the slave line card 1101 and master line cards 1105 generate the local SYNC signal by dividing system clock signal SYSCLK generated by DPLL 1121 in a divider (not shown in FIG. 11) to the target frequency.

The exact position of the SYNC edge is derived using a precision time protocol (PTP) servo loop that uses time information inside the incoming Synchronous Ethernet (SyncE) packet stream to slave line card 1101 on input DATA_IN 1116 of physical interface 1123. The timestamps exchange allows determination of one-way delay (OWD) and error offset between the upstream PHY and the downstream PHY. That time stamp exchange allows the slave line card to determine the correct time provided by the upstream PHY even with delays between the upstream PHY and the downstream PHY. Note that the high level description of the PTP servo loop is provided as background information to provide context in which various embodiments of the digital phase-locked loop described herein can be utilized.

Slave line card 1101 and master timing card 1103 also have a closed loop PTP servo system in accordance with the IEEE 1588 protocol that corrects the position of the SYNC signal over process, voltage, and temperature (PVT) and aligns the SYNC signals distributed by the master timing card 1103 to the timing of the incoming packet stream to the slave line card. The servo loop ensures that the slave line card and the master timing card are synchronized. The slave line card 1101 and the master timing card 1103 exchange information in the closed loop system to adjust the CLK and SYNC pair on the master timing card such that the slave line card ToD is aligned with the network ToD of the chosen incoming data stream on DATA_IN 1116. The PTP servo loop adjusts the timing of SYNC by adjusting DPLL 1117 so that the slave line card ToD is aligned in frequency and phase to the upstream ToD received by the slave line card on input DATA_IN 1116. The distributed system clock signal SYSCLK is distributed and supplied as a reference clock to DPLL 1121 within each of the line cards and the line card digital phase-locked loops generate a local system clock signal SYSCLK and SYNC signal that is phase and frequency aligned with the distributed system clock signal SYSCLK and SYNC signal. The master line cards 1105 are duplicates (up to 64 copies) of the slave line card 1101 but without the closed loop PTP servo loop. In other words, the distribution of the CLK/SYNC pair to the master line cards 1105 is open loop (i.e., without the PTP closed loop adjustments). The timing card and various line cards communicate, at least in part, utilizing a serial communication bus (not shown in FIG. 11) to transmit various status and configuration information. Use of the digital phase-locked loop including linear prediction to suppress spurs described above reduces errors and improves the performance of system 1100.

Thus, linear prediction techniques that determine the location of spurious content in a digital phase-locked loop and suppress the spurious content from propagating to an output of the digital phase-locked loop have been described. The description of the invention set forth herein is illustrative and is not intended to limit the scope of the invention as set forth in the following claims. For example, while the invention has been described in an embodiment in which the digital phase-locked loop has a multi-loop architecture, one of skill in the art will appreciate that the teachings herein can be utilized with digital phase-locked loops having single loop architectures or other multi-loop architectures. The terms "first," "second," "third," and so forth, as used in the claims, unless otherwise clear by context, is to distinguish between different items in the claims and does not otherwise indicate or imply any order in time, location or quality. For example, "a first received signal," "a second received signal," does not indicate or imply that the first received signal occurs in time before the second received signal. Variations and modifications of the embodiments disclosed herein may be made based on the description set forth herein, without departing from the scope of the invention as set forth in the following claims.

What is claimed is:

1. A method for generating a clock signal using utilizing a digital phase-locked loop, the method comprising: filtering a digital signal of the digital phase-locked loop using utilizing an all-zero filter having P weights, the P weights corresponding to P zeros of the all-zero filter at frequencies of P spurs in the digital signal, P being an integer greater than one.

2. The method as recited in claim 1, wherein the P weights are determined based on an all-pole transfer function of spurious energy associated with the digital phase-locked loop, the all-pole transfer function having P poles.

3. The method as recited in claim 1, further comprising utilizing the digital signal to generate a phase-adjusted clock signal based on an input clock signal and a feedback clock signal utilizing a frequency-divided clock signal.

4. The method as recited in claim 3, wherein the digital signal is a timestamp generated based on the input clock signal or generated based on the feedback clock signal.

5. The method as recited in claim 1, further comprising generating the P weights utilizing linear predictive coding of the digital signal.

6. The method as recited in claim 5, wherein generating the P weights comprises autocorrelating each of P values of the digital signal and generating the P weights based on a matrix operation of the autocorrelations.

7. The method as recited in claim 5, wherein generating the P weights comprises minimizing a sum of error squared of prior values of the digital signal and predicted values of the digital signal.

8. The method as recited in claim 1, wherein the P weights are partial correlation coefficients.

9. The method as recited in claim 1, wherein the digital signal is an output of a digital loop filter of the digital phase-locked loop, a divider code provided to a digitally controlled oscillator, or an output interpolative divider code.

10. A digital phase-locked loop comprising:
a time-to-digital converter configured to generate a digital signal based on an input clock signal, the digital phase-locked loop being configured to generate a phase-adjusted clock signal based on the digital signal and a feedback clock signal utilizing a frequency-divided clock signal; and
an all-zero filter coupled between the time-to-digital converter and an output of the digital phase-locked loop, the all-zero filter having P weights, the P weights corresponding to P zeros at frequencies of P spurs in the digital signal, P being an integer greater than one.

11. The digital phase-locked loop as recited in claim 10, further comprising a linear prediction coding filter configured to generate the P weights based on prior values of the digital signal.

12. The digital phase-locked loop as recited in claim 11, wherein the linear prediction coding filter uses an all-pole transfer function to estimate spurious energy associated with the digital phase-locked loop.

13. The digital phase-locked loop as recited in claim 11, wherein the linear prediction coding filter is configured to compute an autocorrelation value for each of P values of the digital signal and to generate the P weights based on a matrix operation of the autocorrelation values.

14. The digital phase-locked loop as recited in claim 10, wherein determining the P weights comprises minimizing a sum of error squared of prior values of the digital signal and predicted values of the digital signal.

15. The digital phase-locked loop as recited in claim 10, wherein the all-zero filter is coupled between the time-to-digital converter and a digital loop filter, is coupled to a first output of a digitally controlled oscillator, or is coupled to a second output of an interpolative divider.

16. The digital phase-locked loop as recited in claim 10, further comprising a digital loop filter coupled between the time-to-digital converter and the all-zero filter.

17. The digital phase-locked loop as recited in claim 10, wherein the all-zero filter is a lattice filter and the P weights are partial correlation coefficients.

18. A method for generating a clock signal utilizing a digital phase-locked loop, the method comprising: determining P weights of an all-pole transfer function having P poles corresponding to locations of spurious energy in a digital signal of the digital phase-locked loop, the P weights being determined based on the digital signal of the digital phase-locked loop, P being an integer greater than one.

19. The method as recited in claim 18, further comprising utilizing the digital signal to generate a phase-adjusted clock signal based on an input clock signal and a feedback clock signal utilizing a frequency-divided clock signal.

20. The method as recited in claim 18, wherein the P poles are determined utilizing linear predictive coding of the digital signal.

21. The method as recited in claim 18, further comprising filtering the digital signal utilizing an all-zero filter having P zeros based on the P weights.

22. The method as recited in claim 21, wherein the all-zero filter is a lattice filter and the P weights are partial correlation coefficients.

23. The method as recited in claim 18, wherein determining the P weights comprises minimizing a sum of error squared of prior values of the digital signal and predicted values of the digital signal.

24. The method as recited in claim 18, wherein determining the P weights comprises autocorrelating each of P values of the digital signal and generating the P weights based on a matrix operation of the autocorrelations.

* * * * *